United States Patent
Sharma et al.

(10) Patent No.: US 11,569,243 B2
(45) Date of Patent: Jan. 31, 2023

(54) STACKED-SUBSTRATE DRAM SEMICONDUCTOR DEVICES

(71) Applicant: INTEL CORPORATION, Santa Clara, CA (US)

(72) Inventors: Abhishek A. Sharma, Hillsboro, OR (US); Willy Rachmady, Beaverton, OR (US); Ravi Pillarisetty, Portland, OR (US); Gilbert Dewey, Beaverton, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 970 days.

(21) Appl. No.: 16/140,890

(22) Filed: Sep. 25, 2018

(65) Prior Publication Data

US 2020/0098762 A1 Mar. 26, 2020

(51) Int. Cl.
*H01L 27/108* (2006.01)
*H01L 23/48* (2006.01)

(52) U.S. Cl.
CPC ...... *H01L 27/10826* (2013.01); *H01L 23/481* (2013.01); *H01L 27/1085* (2013.01); *H01L 27/10885* (2013.01); *H01L 27/10891* (2013.01); *H01L 27/10897* (2013.01)

(58) Field of Classification Search
CPC ............. H01L 27/10826; H01L 23/481; H01L 27/1085; H01L 27/10885; H01L 27/10891; H01L 27/10897; H01L 27/0688
See application file for complete search history.

(56) References Cited

U.S. PATENT DOCUMENTS

| | | | |
|---|---|---|---|
| 8,148,772 B2 | 4/2012 | Doyle et al. | |
| 8,824,159 B2 | 9/2014 | Leedy | |
| 9,565,766 B2 | 2/2017 | Lindert et al. | |
| 2008/0106938 A1 | 5/2008 | Ishii | |
| 2009/0294833 A1 | 12/2009 | Kim | |
| 2014/0119099 A1* | 5/2014 | Clark | G11C 11/4091 365/149 |
| 2020/0099509 A1* | 3/2020 | Sharma | H04L 9/0816 |

OTHER PUBLICATIONS

Partial European Search Report received for EP Application No. 19183099.1, dated Jan. 13, 2020. 15 pages.
Tobias Höchbauer, "On the Mechanisms of Hydrogen Implantation Induced Silicon Surface Layer Cleavage", Nov. 2001, presented by Department of Chemistry the Philipps University Marburg, 209 pages.
Kirk Saban, "Xilinx Stacked Silicon Interconnect Technology Delivers Breakthrough FPGA Capacity, Bandwidth, and Power Efficiency", Dec. 11, 2012, White Paper: Virtex-7 FPGAs, Xilinx, WP380 (v1.2), 10 pages.

* cited by examiner

*Primary Examiner* — Shouxiang Hu
(74) *Attorney, Agent, or Firm* — Schwabe, Williamson & Wyatt, P.C.

(57) ABSTRACT

A DRAM integrated circuit device is described in which at least some of the peripheral circuits associated with the memory arrays are provided on a first substrate. The memory arrays are provided on a second substrate stacked on the first substrate, thus forming a DRAM integrated circuit device on a stacked-substrate assembly. Vias that electrically connect the memory arrays on the second substrate to the peripheral circuits on the first substrate are fabricated using high aspect ratio via fabrication techniques.

15 Claims, 9 Drawing Sheets

STACKED-SUBSTRATE DRAM SEMICONDUCTOR DEVICES

BACKGROUND

A dynamic random access memory (DRAM) generally includes an array of bit cells, each cell capable of storing a bit of information. A typical cell configuration consists of a capacitor for storing a charge (i.e., corresponding to a bit of information) and an access transistor that controls access to the capacitor during read and write operations. The access transistor is connected between a bit line and the capacitor, and is "gated" (turned on or off) by a word line signal. During a read operation, the stored bit of information is read from the cell via the associated bit line. During a write operation, a bit of information is stored into the cell from the bit line via the transistor. The cells are dynamic in nature (due to leakage), and therefore must be periodically refreshed so that the stored data persist.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

It is noted that designations such "above" or "below" or "top" or "bottom" or "top side" or "bottom side" are not intended to necessarily implicate a limitation as to orientation of the embodiments described herein. Rather, such terminology is simply used in a relative sense to consistently describe a structure as it exists in any one particular orientation and as illustrated herein. In addition, designations such as "over" are not intended to necessarily implicate a limitation as to one structure being distinct from another underlying structure. For example, if an integrated circuit integrated circuit is over a first semiconductor substrate and below a second semiconductor substrate, the integrated circuit may be formed on a topside of the first substrate by depositing additional materials onto the topside of the first substrate, or by shaping (by way of lithography and etching) a portion of the first substrate into one or more parts of the integrated circuit, or by a combination such depositing and shaping. In still other embodiments, the integrated circuit may be formed on a backside of the second substrate by depositing additional materials onto the backside of the second substrate, or by shaping (by way of lithography and etching) a portion of the second substrate into one or more parts of the integrated circuit, or by a combination such depositing and shaping.

DETAILED DESCRIPTION

Techniques are disclosed for fabricating a stacked-substrate DRAM integrated circuit device in which at least some of the semiconductor devices associated with peripheral circuits are provided on a first substrate. The memory arrays are provided on a second substrate stacked on the first substrate, thus forming a DRAM integrated circuit device having a stacked-substrate assembly. The second substrate has a thickness of less than 200 nm in some example cases, or less than 100 nm in still other example cases. Vias are fabricated to pass through the second substrate and into a dielectric layer between the first substrate and the second substrate. The vias electrically connect the memory arrays with conductive interconnections associated with the peripheral circuits. By placing semiconductor devices of the peripheral circuits on the first substrate in a stacked-substrate configuration, as variously described herein, a density of memory cells per unit surface area ("density" for brevity) of a substrate is dramatically increased relative to DRAM devices in which peripheral circuits and memory arrays are on a same substrate. Furthermore, by having a second substrate that is less than 100 nm or less than 200 nm thick, the vias passing through the substrate can have a depth that is less than 200 nm (e.g., less than 150 nm). Vias having such a relatively short length can result in favorable electrical characteristics (e.g., a low resistance of between 1 Ohm and 40 Ohms).

General Overview

Figure 1A:
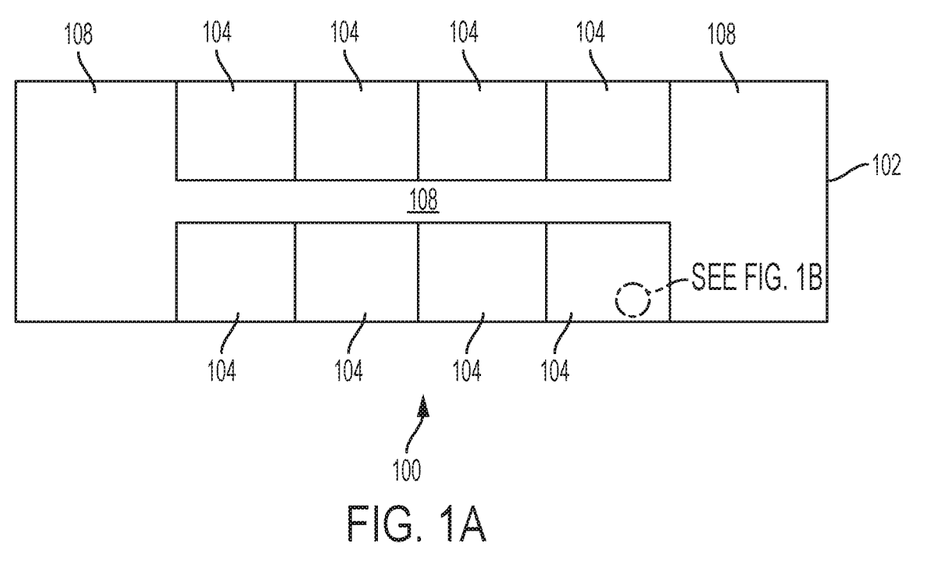
FIG. 1A is a schematic plan view of a DRAM device that includes peripheral circuitry areas and multiple memory arrays, the figure illustrating the proportion of device surface area occupied by the memory arrays relative to the peripheral circuitry.
Figure 1B:
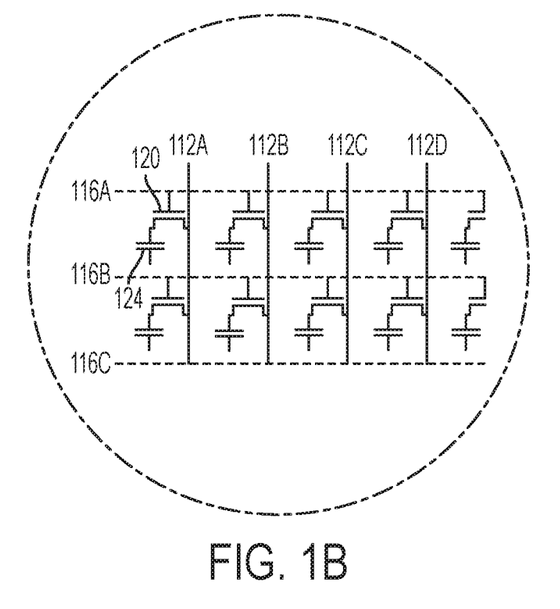
FIG. 1B is a circuit diagram of individual memory cells from a portion of one memory array of the DRAM device illustrated in FIG. 1A.

For both logic devices and memory devices, increasing a density of circuits per unit area of substrate is often accomplished by shrinking the dimensions of transistors and their associated interconnections. Shrinking these dimensions often requires changes to one or more of circuit design ground rules, semiconductor device configuration, and processing techniques. In the case of DRAM devices, reducing the size of the transistors and capacitors associated with each memory cell has increased DRAM memory cell density over time. However, the peripheral circuitry (which includes both conductive interconnects and their associated semiconductor devices) used to read from and write to individual memory cells still occupies a significant proportion of the surface area of a DRAM device. In some cases, the peripheral circuitry (e.g., sense amplifiers, addressed decoders, muxes, row and column select circuitry, power select circuitry) can occupy as much as 45% of the surface area on a substrate of a DRAM device. This is illustrated schematically in FIG. 1A, which depicts a DRAM device 100. The illustrated example DRAM device 100 includes memory arrays 104 and areas associated with peripheral circuitry 108, all of which are disposed on a substrate 102. Each of the memory arrays 104 includes a plurality of individual memory cells, some of which are illustrated in circuit diagram depicted in FIG. 1B. Each memory cell includes a capacitor 124 that is capable of storing electrical charge and an access transistor 120 that controls the charging or discharging of the capacitor 124. Bit lines 112A-112D and word lines 116A-116C are associated with these individual memory cells and allow for the reading, writing, and addressing of data stored within each capacitor 124. Returning to FIG. 1A, the significant proportion of surface area of the device 100 occupied by peripheral circuits 108 is apparent. The significant proportion of device surface area occupied by peripheral circuits 108 is a challenge to increasing the density of memory arrays 104 (and the constituent individual memory cells) on the device 100.

Thus, techniques are described herein for fabricating a stacked-substrate DRAM device in which a second substrate is stacked over a first substrate. Peripheral circuits (e.g., semiconductor devices and at least some conductive interconnections) used to read from, write to, and address data to the memory cells can be fabricated on the first substrate. Memory arrays are fabricated on the second substrate, which is stacked over the first substrate. Vias passing through the second substrate, into an interlayer dielectric between the first substrate and the second substrate make contact with interconnections of the peripheral circuits, thus placing the memory cells of the second substrate in electrical communication with the peripheral circuits of the first substrate. In this way, the proportion of peripheral circuitry occupying surface area on the second substrate is dramatically reduced, thus increasing a density of memory cells on the second substrate. Furthermore, because some examples of the second substrate are less than 200 nm or less than 100 nm in thickness, the vias passing through the second substrate have a length that can also be less than 200 nm, thus enabling a low enough electrical resistance (e.g., from 1 Ohm to 40 Ohms) to support high rates of data transmission (e.g., in the gigahertz range).

Example Device

Figure 1C:
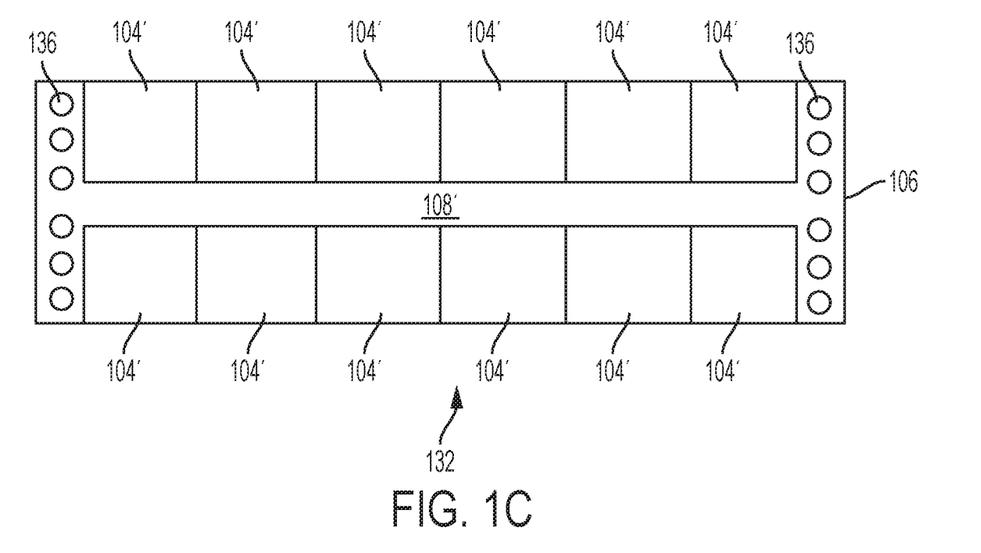
FIG. 1C is a schematic plan view of a stacked-substrate DRAM device in which some peripheral circuits are fabricated on a first substrate (not shown) disposed below a second substrate on which memory arrays are fabricated, in accordance with some embodiments of the present disclosure.

A schematic plan view of one embodiment of a stacked-substrate DRAM device 132 of the present disclosure appears in FIG. 1C. This figure is drawn primarily for convenience of explanation and comparison to FIG. 1A. A cross-sectional view of a stacked-substrate device 132 appears in FIG. 1D. It will be appreciated that while embodiments described herein primarily are focused on those in which memory cells are disposed on a second substrate that is stacked over a first substrate of peripheral circuits, other embodiments may include an opposite configuration, namely memory arrays on the first substrate and peripheral circuits on the second substrate that is stacked over the first substrate. It will also be appreciated that other embodiments within the scope of the present disclosure may include a mix of peripheral circuits and memory cells on both the first substrate and the second substrate.

In FIG. 1C, the plan view illustrates memory arrays 104', areas associated with peripheral circuits 108', and vias 136, all of which are shown on a second substrate 106.

Figure 1D:
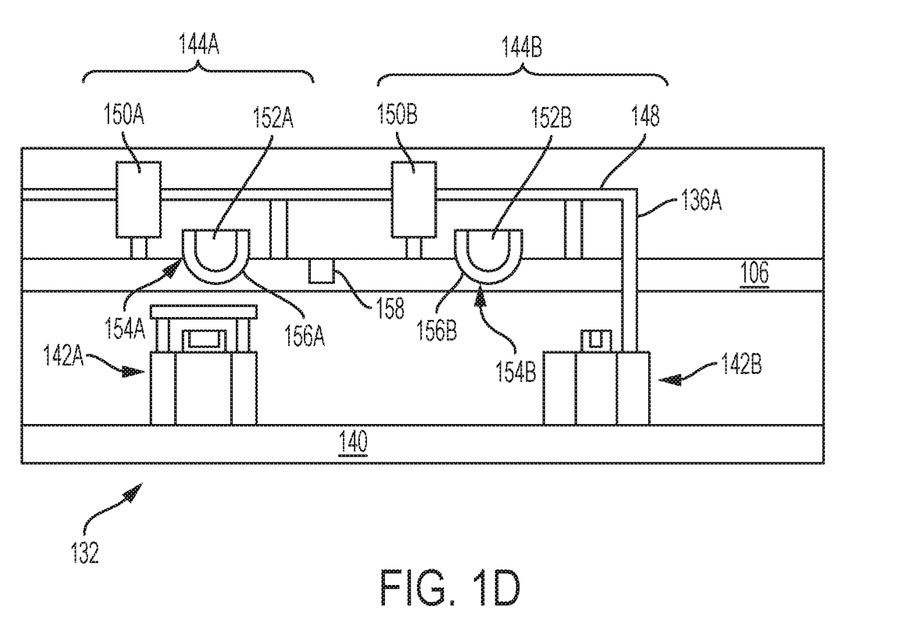
FIG. 1D illustrates a cross-sectional view of a portion of the stacked-substrate DRAM device depicted in FIG. 1C, in accordance with some embodiments of the present disclosure.

The example device 132 includes an increased proportion of area for memory arrays 104' on the second substrate 106 surface and a decreased area for peripheral circuits 108' when compared to the device 100. The peripheral circuits 108' (or the portions thereof) that are present on the second substrate 106 are primarily those that connect the memory arrays 104' to the vias 136 (e.g., conductive lines between memory arrays 104' and vias 136). As will be explained below in more detail, the semiconductor devices (e.g., FinFET transistors) associated with the peripheral circuits 108' are used for operating memory arrays 104' and are primarily disposed on a first substrate below the second substrate 106 (as shown in FIG. 1D). That is, the first substrate of the stacked substrate device 132 includes at least some of the peripheral circuits 108' used to read from, write to, and address data to memory cells.

FIG. 1D illustrates a cross sectional view of the stacked-substrate device 132. The cross-sectional view of the device 132 includes a first substrate 140, the second substrate 106 (visible in plan view FIG. 1C), peripheral circuit semiconductor devices 142A, 142B, DRAM memory cells 144A, 144B, and via 136A. The cross-section is taken in a direction perpendicular to the word lines 154A, 154B of the memory array cells.

As explained above, the second substrate 106 is stacked over the first substrate 140 to form the stacked-substrate DRAM device 132. As also explained above, the second substrate 106 can be less than 200 nm or even less than 100 nm thick. This thickness of the second substrate 106 influences the depth of the via 136A. The thinner the substrate 106, generally the shorter the via 136A needed to place the bit line 148 in contact with a peripheral circuit. Vias 136A having a depth that is on the order of less than 200 nm or less than 100 nm are thus dimensioned similar to vias in "back end of line" (BEOL) interconnections, with similar electrical properties (e.g., low resistance).

The DRAM memory cells 144A, 144B over the second substrate 106 includes capacitors 150A, 150B, bit line 148, and word lines 154A, 154B. The word lines include a gate dielectric layer 156A, 156B and a gate electrode 152A, 152B. The word lines can be biased on and off so as to selectively access stored charge (or lack thereof) in capacitors 150A, 150B when used in connection with the bit line 148. An isolation barrier 158 electrically isolates the word lines from one another. The isolation barrier 158 can be a recessed (e.g., 10-50 nm below a surface of the substrate 106) plug of dielectric material (e.g., SiO2) or can even be a "dummy" word line that is either always bias in an off state or is not electrically biased at all. In some examples, this isolation barrier 158 is formed using techniques applicable to the formation of shallow trench isolation or "STI."

FinFET semiconductor devices 142A, 142B are elements of peripheral circuits disposed on the first substrate 140 stacked below the second substrate 106. These schematically illustrated devices 142A, 142B can be used for any of the functions associated with writing to, reading from, addressing, or otherwise controlling the DRAM memory cells 144A, 144B. The fabrication of analogous devices is described below in more detail.

Architecture and Methodology

Figure 2:
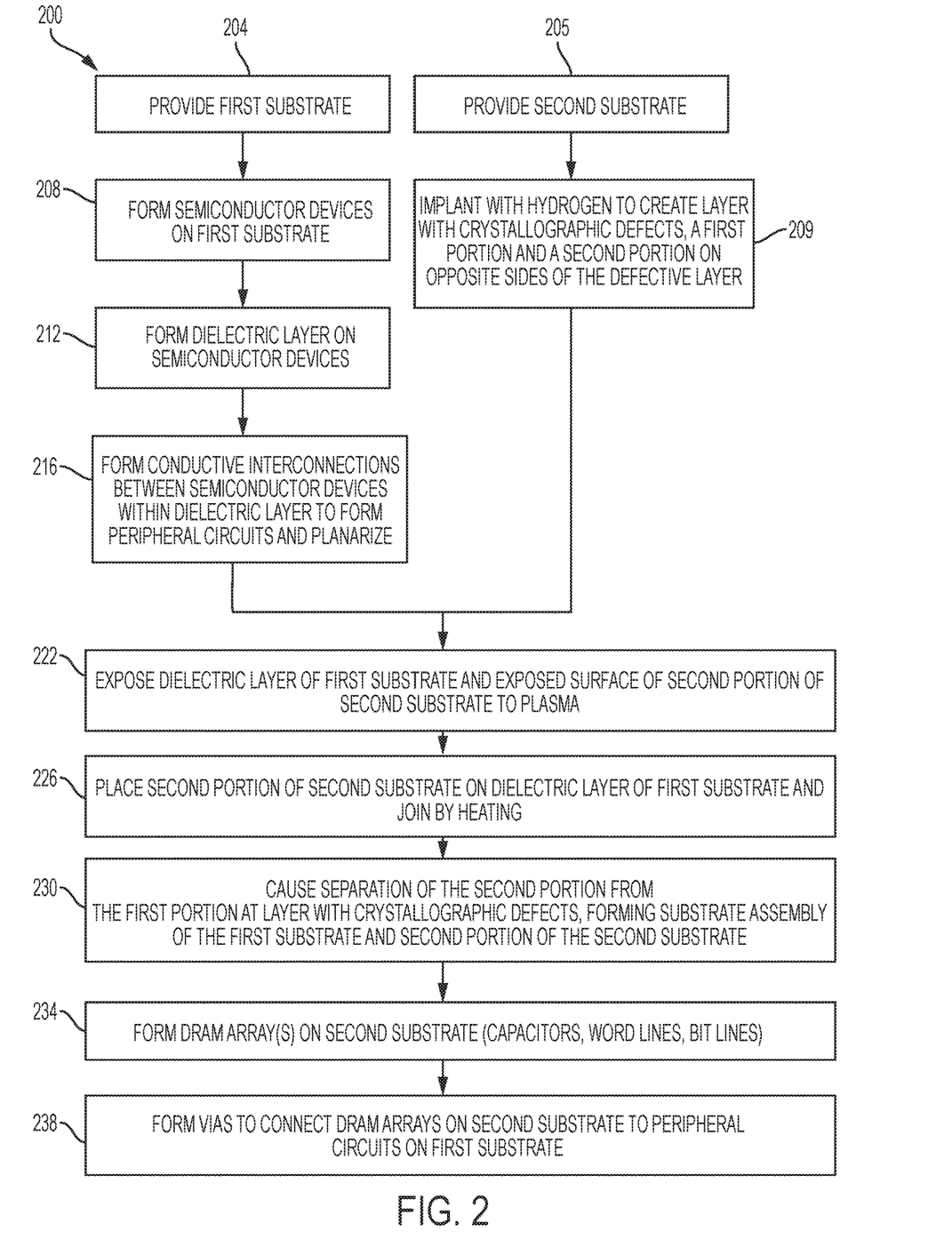
FIG. 2 is a method flow diagram of an example method for the fabrication of a stacked-substrate DRAM device, in accordance with some embodiments of the present disclosure.

FIG. 2 illustrates an example method 200 by which embodiments of the present disclosure can be fabricated. FIGS. 3A-3G illustrate cross-sectional views of various stages of fabrication of the example method depicted in FIG. 2. Concurrent reference to FIG. 2 and FIGS. 3A-3G will facilitate explanation.

Figure 3A:
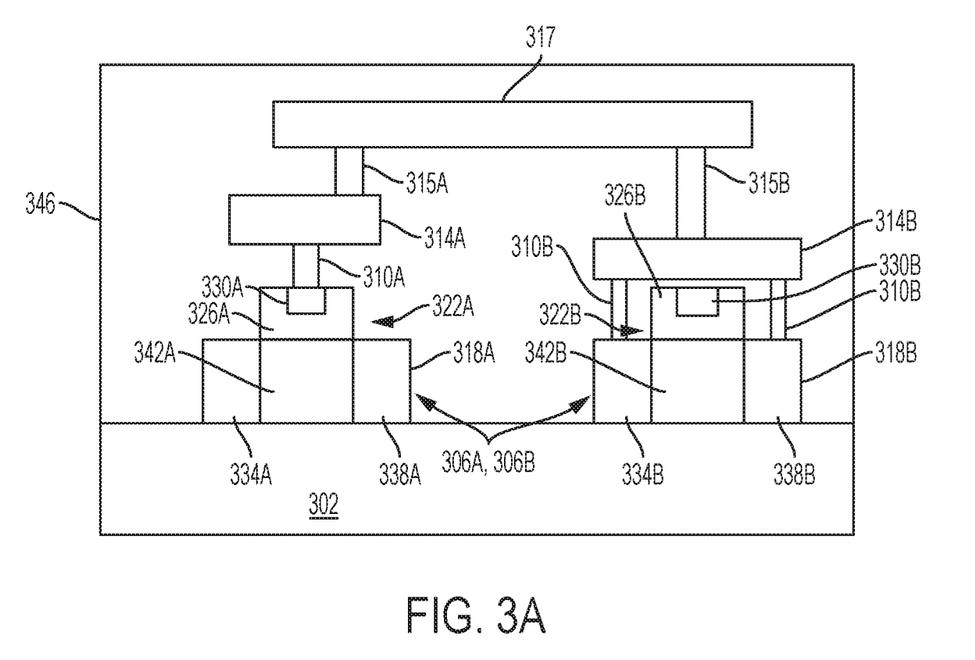
FIGS. 3A-3G illustrate example integrated circuit (IC) structures resulting from a method for forming a stacked-substrate DRAM device, as illustrated in FIG. 2, in accordance with some embodiments of the present disclosure.
Figure 3B:
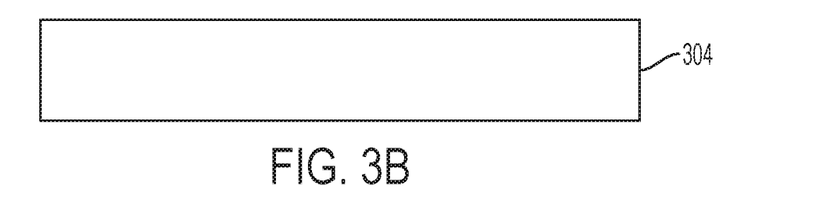

The method 200 includes providing 204 a first substrate 302 (as shown in FIG. 3A with various peripheral circuits, described in more detail below) and providing 205 a second substrate 304 (as shown in FIG. 3B). As will be described below in more detail, in some embodiments, peripheral circuits can be fabricated on the first substrate 302. These peripheral circuits can be used to write to, read from, and otherwise control memory cells and memory arrays of a DRAM device. In some embodiments, the memory cells (and the memory arrays formed by groups of individual memory cells) are fabricated on the second substrate 304.

For both the first substrate 302 and the second substrate 304, any number of suitable substrate types and materials can be used. The substrate may be, for example, a bulk semiconductor wafer (e.g., bulk silicon, germanium, gallium arsenide or other III-V materials, etc.) or an on-insulator configuration (e.g., silicon on-insulator, germanium on-insulator, silicon germanium on-insulator, indium phosphide on-insulator, etc.). In other examples, the substrate (whether one or both of the first substrate 302 and the second substrate 304) may be: gallium nitride (GaN); c-axis aligned indium gallium zinc oxide (c-IGZO); transition metal dichalcogenides including but not limited to MoS2, MoSe2, CuS2, CuSe2, WS2, WSe2, among others; black phosphorus; or InGaAs. The substrate may be p-type, n-type, neutral-type, high or low resistivity, off-cut or not off-cut, etc. The substrate may have a vicinal surface that is prepared by off-cutting the substrate from an ingot, wherein substrate is off-cut at an angle between, for instance, 2° and 8° (e.g., 4° off-cut silicon). Note, however, the substrate need not have any such specific features, and that embodiments of the present disclosure can be implemented using any one of more of numerous different substrates. The thickness of the first substrate 302 can vary and in some embodiments, for example, is in the range of 100 nm to thousands of nanometers. In some cases, the substrate may be subsequently thinned or removed (e.g., by way of backside polish or other suitable thinning/removal process), after formation of the interconnect structure and application of protective layer such as etch stop, passivation layer, inter-layer dielectric (ILD), capping layer, etc. The thickness of the second substrate 304 as provided 205 can be of similar dimension to that of the first substrate 302. Techniques for thinning the second substrate 304 so as to maintain a height of a via through the second substrate to less than 100 nm or less than 200 nm are described below.

Once the first substrate 302 has been provided 204, semiconductor devices 306A, 306B (collectively 306, corresponding to peripheral circuits) can be formed 208 on the first substrate 302. Examples of peripheral circuits include, but are not limited to, sense amplifiers, multiplexers, row and column select circuitry, power select circuitry, among others. Conductive vias and conductive lines 314 (described below) can connect various semiconductor devices 306 together, thus forming peripheral circuits.

In some example embodiments, the semiconductor devices 306A, 306B can be formed 208 using standard metal oxide semiconductor (MOS) processing, although any desired process technology can be used. In some examples, such as the one shown in FIG. 3A, the semiconductor devices 306 of the peripheral circuits 306 can be formed 208 using fin-based semiconductor devices, including field effect transistors (also known as "FinFETs"). A FinFET is a MOSFET transistor built around a thin strip of semiconductor material (generally referred to as a fin) that extends from and above an underlying substrate (in this case, the substrate 302). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin).

As shown in FIG. 3A, the fins 318 (318A, 318B in the example shown) of the semiconductor devices 306 include a salient feature composed of a semiconductor material and configured to extend from and above a substrate surface. In some examples, a fin 318 of semiconductor material can be patterned (e.g., lithographically masked and then etched) from the first substrate 302 itself or from a layer of material formed on the substrate 302 that is compositionally different from the first substrate 302. Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Regardless of the composition, a gate structure 322 (322A, 322B on corresponding fins 318A, 318B) comprising at least one layer of gate dielectric 326 (326A, 326B on corresponding fins 318A, 318B) and at least one layer of gate electrode 330 (330A, 330B on corresponding fins 318A, 318B) can be fabricated on the one or more the fins 318.

Examples of materials that can be used to form the gate dielectric layer 326 include, but are not limited to, dielectric materials used for interlayer dielectric (ILD) described below, as well as "high-k" materials, or both. High-k dielectric materials are those generally considered to have a dielectric constant greater than that of silicon dioxide and include, but are not limited to hafnium oxide, hafnium silicon oxide, lanthanum oxide, lanthanum aluminum oxide, zirconium oxide, zirconium silicon oxide, tantalum oxide, titanium oxide, barium strontium titanium oxide, strontium titanium oxide, yttrium oxide, aluminum oxide, lead scandium tantalum oxide, and lead zinc niobate. In some embodiments, additional processing may be performed on the high-k dielectric layer, such as an annealing process, to improve the quality of high-k material.

The portions of the fin 318 not covered by the gate structure 322 can be replaced with semiconductor material and/or doped to function as a source region 334 (334A, 334B on corresponding fins 318A, 318B) and a drain region 338 (338A, 338B on corresponding fins 318A, 318B). The portion of the fin 318 between the source region 334 and the drain region 338 and between the substrate 302 and the gate structure 322 is sometimes referred to as a semiconductor body and can be characterized as including a channel region 342 (342A, 342B on corresponding fins 318A, 318B) through which charge carriers can flow. A voltage can be applied to the gate structure to control the flow of charge carriers from the source region 334 to the drain region 338.

A layer of dielectric material 346 (sometimes referred to as interlayer dielectric) can be formed 212 on the semiconductor devices 306. The dielectric layer (ILD) may include any number of conventional dielectric materials commonly used in integrated circuit applications, such as oxides (e.g., silicon dioxide, carbon doped oxide), silicon nitride, or organic polymers (e.g., perfluorocyclobutane or polytetrafluoroethylene), fluorosilicate glass, and organosilicates (e.g., silsesquioxane, siloxane, or organosilicate glass). The dielectric material may be low-k or high-k depending on the desired isolation, and may include pores or other voids to further reduce its dielectric constant. Examples of high-k materials have been described above. The dielectric layer thickness can vary and in some example embodiments is in the range of 50 nm to 5000 nm. In some embodiments, the dielectric layer may actually include multiple layers having the same or differing thicknesses. Likewise, in some embodiments, each ILD layer is implemented with the same dielectric material, but in other embodiments, at least some of the ILD layers are implemented with differing dielectric materials.

Techniques for forming 212 the layer of dielectric material 346 can be any of a wide range of suitable deposition techniques, including but not necessarily limited to: physical vapor deposition (PVD); chemical vapor deposition (CVD); spin coating/spin-on deposition (SOD); and/or a combination of any of the aforementioned. Other suitable configurations, materials, deposition techniques, and/or thicknesses for base ILD layer 346 will depend on a given application and will be apparent in light of this disclosure. Numerous ILD configurations and dimensions will be apparent in light of this disclosure and the claimed invention is not intended to be limited to any particular configurations and dimensions. In some embodiments after forming, the ILD can be planarized and/or polished using any suitable technique including chemical-mechanical planarization/polishing (CMP) processes, for example.

As also shown in FIG. 3A, conductive interconnect structures (e.g., contact structures or "vias" 310A, 310B, 315A, 315B) and conductive lines (314A, 314B, 317) can then be formed 216 within the dielectric layer 346. The electrical connection established by the conductive interconnect structures 310, 315, 314, 317 between semiconductor devices 306 thus forms the peripheral circuits (examples of which are described above) used to control the DRAM memory cells and arrays of memory cells. In some examples, the conductive interconnections can be formed of the same materials, and in other cases, may include compositionally different materials, whether different from layer to layer and/or within the same layer. For example, one or more of the vias 310, 315 and the conductive lines 314, 317 can include one or more layers of a conductive liner (e.g., silicon nitride, graphene, tantalum nitride) and one more layers of a conductive metal (e.g., copper, aluminum).

Formation 216 of these conductive interconnect structures can be performed by standard processes of photolithographic patterning and etching (e.g., removal of portions of the dielectric layer 346), followed by deposition of one or more layers in the patterned and etched regions of the dielectric layer 346. Example deposition techniques applicable to conductive material include but are not limited to sputtering, physical vapor deposition (PVD), chemical vapor deposition (CVD), metallo-organic CVD (MOCVD), among others. In some examples, metal lines and vias can be implemented as a dual damascene structure fabricated in the corresponding dielectric layer (ILD). Other embodiments may employ other interconnect structures (e.g., single damascene or other suitable metal interconnect pathway where interconnect metal can be provisioned). The dual damascene trench can be formed in the dielectric layer, for example, using standard lithography including via and trench patterning and subsequent etch processes followed by polishing, cleans, etc., as typically done. As with the preceding examples, the patterning and etch processes can be carried out, for instance, using wet and/or dry etch techniques.

The trenches in the ILD in which vias and conductive lines are formed can have various dimensions depending on the application. In one example case, an upper trench opening (i.e., corresponding to a conductive line portion of a dual damascene via/conductive line structure) is about 10 nm to 100 nm (e.g., 20 to 50 nm) and a lower via opening is about 5 nm to 50 nm (e.g., 10 to 25 nm), and the entire structure has an aspect ratio in the range of about 10:1 to 1.25:1 (e.g., 5:1). As will be appreciated, however, the dimensions and aspect ratio of the damascene trench will vary from one embodiment to the next, and the present disclosure is not intended to be limited to any particular range of dimensions, or any particular trench configuration.

In a more general sense, conductive interconnect cross-sections can include a profile having a first lateral width and a second lateral width that is smaller than the first lateral width, while in another example case the metal interconnect pathway cross-section demonstrates a profile having a substantially uniform lateral width from top to bottom.

In other examples, rather than forming trenches in ILD, the conductive interconnections can be formed by first forming a blanket layer of conductive material followed by patterning and etching of the blanket layer into the conductive interconnect structures illustrated in FIG. 3A. The conductive interconnect structures formed in this way can be electrically isolated from one another by subsequent deposition of dielectric material, as described above.

Note that the layout shown in FIG. 3A (and subsequent figures) is not intended to implicate any particular feature spacing or density. Rather, this layout is simply an arbitrary example, and any number of other layout designs can benefit from an embodiment of the present invention. In some examples, the layers of interconnection (e.g., vias and conductive lines) are demarcated from neighboring layers by an etch stop layer (e.g., a nitride layer) and may also include a barrier layer to prevent electromigration of material between adjacent conductive interconnect structures (e.g., nitride layers, among others).

As mentioned above, the method 200 also includes providing 205 a second semiconductor substrate 304, which in various embodiments can be any one of the substrate compositions or types previously described in the context of the first substrate 302. As indicated above, the final thickness of the second substrate as integrated into a stacked-substrate DRAM device is less than 200 nm or less than 100 nm so as to facilitate a similar depth (e.g., less than 200 nm or less than 100 nm) of a via connecting the DRAM memory cells to the peripheral circuits.

Figure 3C:
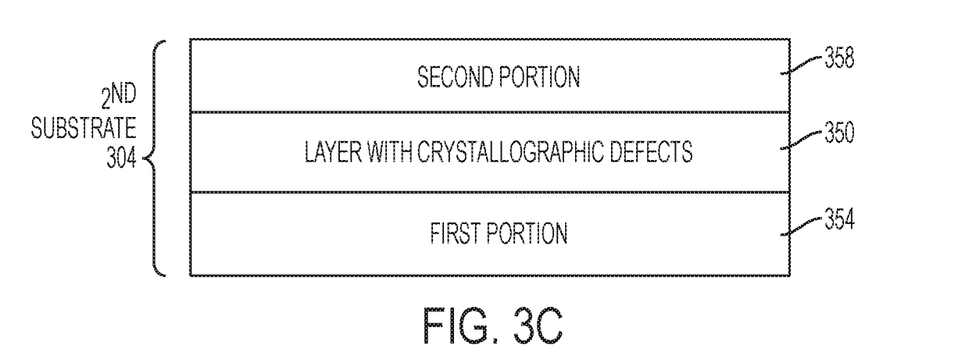

To accomplish this thinning, the second substrate 304 can be first implanted 209 with, for example, accelerated hydrogen ions through one of the exposed surfaces. In some examples, as shown in FIG. 3C, the accelerated hydrogen ions cause the formation of a sub-surface layer 350 with crystallographic defects that can be between from 5 nm to 500 nm below the surface through which the ions penetrate. More generally, the accelerated ions interact with atoms within the lattice of the second substrate 304 so as to displace some of the atoms from crystal lattice sites, thus forming vacancies within the crystalline lattice as one type of crystallographic defect. In some examples, dislocations and dislocation loops can form as another type of crystallographic defect. Regardless of the type or types of crystallographic defects that are formed by ion implantation, the defective layer 350 formed is a location at which the substrate 304 will cleave upon heat treatment.

In some examples, implantation can be accomplished by accelerating hydrogen ions (formed by exposure of hydrogen gas to an electrically biased filament so as to form a hydrogen plasma) at voltages of anywhere between 20 keV to 100 keV. Implantation densities of on the order of $10^{1.5}$ atoms/cm$^3$ to $10^{22}$ atoms/cm$^3$ can be used to form the defective layer 350. In some examples, the implantation current is from 5 mA/cm$^2$ of substrate to 10 mA/cm$^2$. In some examples, accelerated hydrogen ions within the previously indicated acceleration voltages and implantation densities are capable of producing on the order of from $10^{20}$ vacancies/cm$^3$ to $10^{23}$ vacancies/cm$^3$. In a specific example, an accelerating voltage of 40 keV can produce an approximately normal distribution of vacancies from 1 nm to 700 nm below the exposed surface through which the hydrogen ions are implanted, with a median of the distribution at about 500 nm below the surface (+/−50 nm).

In some examples, the defective layer 350 can have a thickness (measured perpendicular to the surface of the substrate 304 through which the accelerated ions pass) within any of the following ranges: from 5 nm to 50 nm; from 5 nm to 25 nm; from 5 nm to 10 nm; from 10 nm to 50 nm; from 25 nm to 50 nm. It will be appreciated that the accelerating voltage of the parting (hydrogen) ions can be selected so that a depth below the surface of the defective layer 350 is within a desired range according to standard techniques. For example, a greater accelerating voltage of the hydrogen ions will cause the hydrogen ions to impinge to a distance greater from the exposed surface than a lower accelerating voltage. In some embodiments, the accelerating voltage is selected to cause the defective layer 350 to be within the range below the surface indicated above (i.e., from 5 nm to 500 nm below the exposed surface).

In other examples, other accelerated particles, including but not limited to helium ions, can be used to create the defective layer 350.

As shown in FIG. 3C, for convenience of explanation, the defective layer 350 can be considered to divide the second substrate 304 into a first portion 354 and a second portion 358 on opposing sides of the defective layer 350. As can be appreciated in light of the present disclosure, a depth of the defective layer 350 essentially defines a thickness of the second portion 358.

Figure 3D:
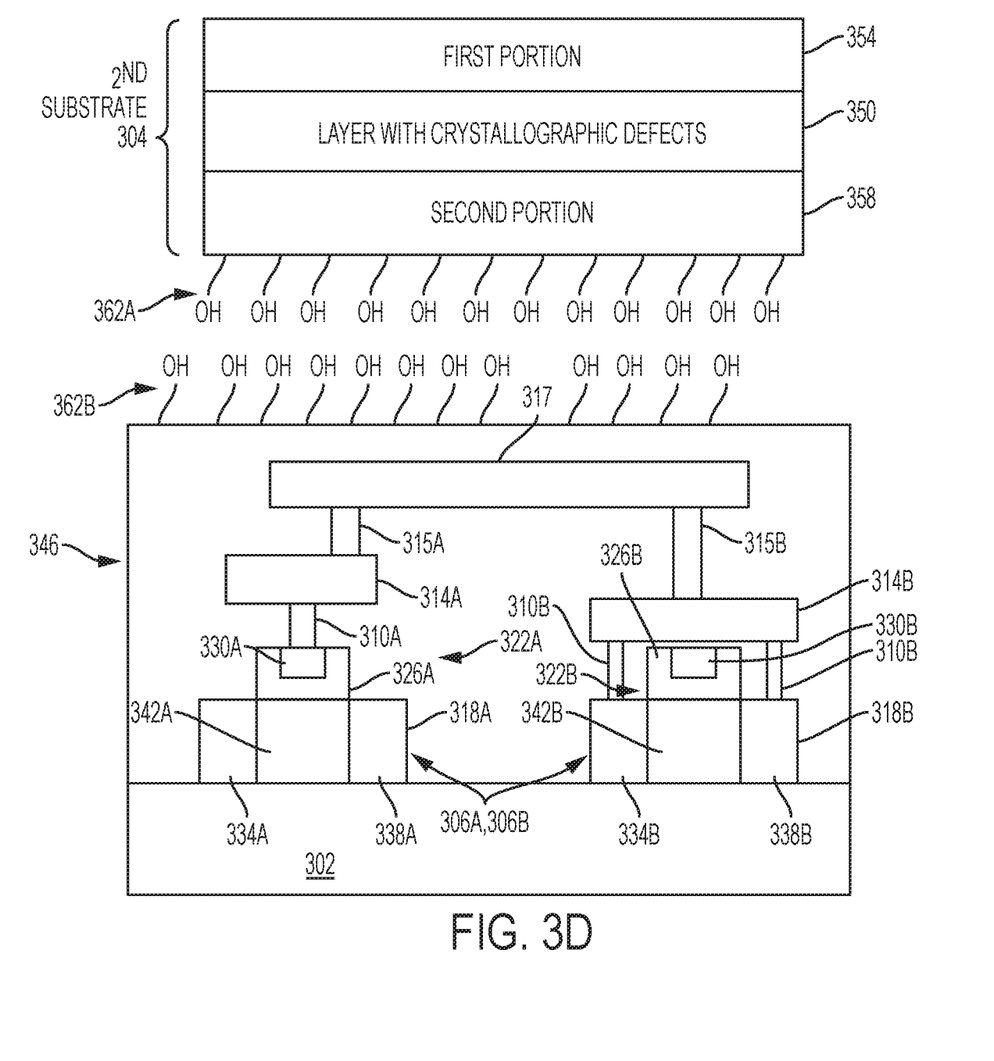

Surfaces of the first substrate 302 (e.g., the dielectric layer 346) and the second substrate 304 (in particular, the exposed surface of the second portion 358 of the second substrate 304) ultimately to be joined together are then exposed 222 to a plasma. In one example, exposure 222 is to an oxygen plasma. In other examples, exposure 222 can be to a UV enhanced ozone ($O_3$) plasma, an aqueous ($H_2O$) ozone solution plasma, or any other plasma chemistry capable of terminating the exposed surfaces in hydroxyl (OH) groups. As schematically shown in FIG. 3D, exposure 222 to the oxygen plasma creates layers 362A, 362B on the treated surfaces that include a plurality of hydroxyl groups.

The method 200 continues by placing 226 the plasma treated surface of the second portion 358 of the second substrate 304 in contact with the plasma treated surface of the first substrate 302, thus bringing the layers 362A, 362B into contact with one another. This initial contact between the plasma treated surfaces can be performed at ambient temperature (e.g., between 20° C. and 25° C.) and ambient atmospheric pressure (e.g., 1 atmosphere+/−5%).

Placing 226 the layers 362A, 362B into contact with one another and then heating the two substrates 302, 304 causes a condensation reaction to occur between hydrogen and hydroxyl groups that terminate the confronting surfaces. In some examples, the two substrates 302, 304 are heated 226 at temperatures anywhere between 300° C. and 400° C. (within normal equipment variation and measurement tolerances of approximately +/−2° C.) for between 10 minutes and 60 minutes in an inert atmosphere (e.g., $N_2$, Ar). As water is produced by the reaction and removed from the interface between the layers 362A, 362B by vaporization, a covalent bond is formed between the second portion 358 of the second substrate 304 and the ILD 346 of the first substrate 302, thus joining the two substrates together. In the case of a second substrate 304 fabricated from silicon, and a dielectric layer 346 fabricated from silicon dioxide, the covalent bonds formed are silicon-oxygen-silicon bonds. The silicon-oxygen-silicon bonds that bridge the interface are strong enough so that no additional adhesive or connection is needed to bond the first substrate 302 to the second substrate 304.

Figure 3E:
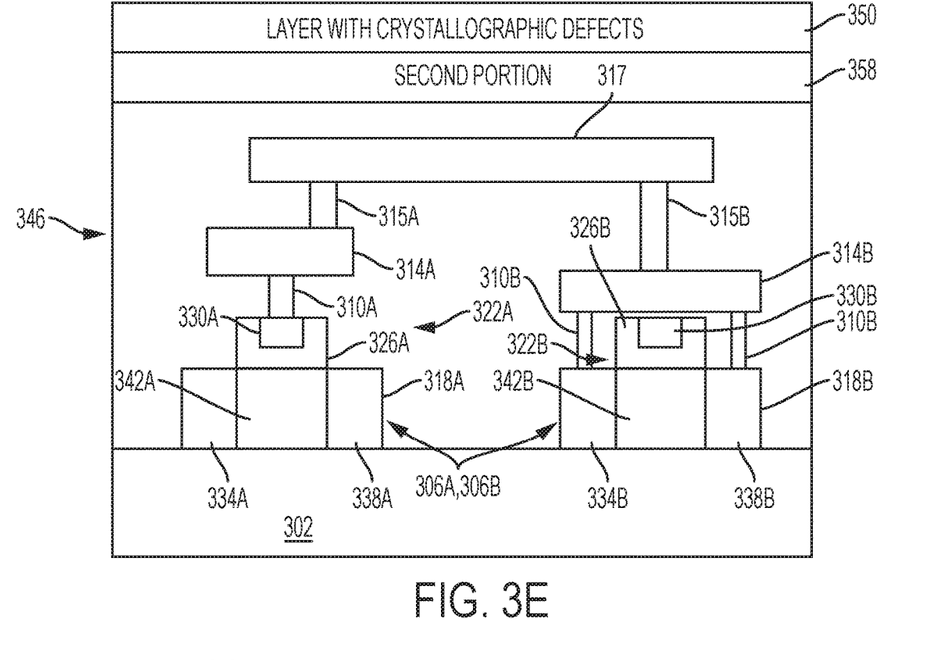
Figure 3F:
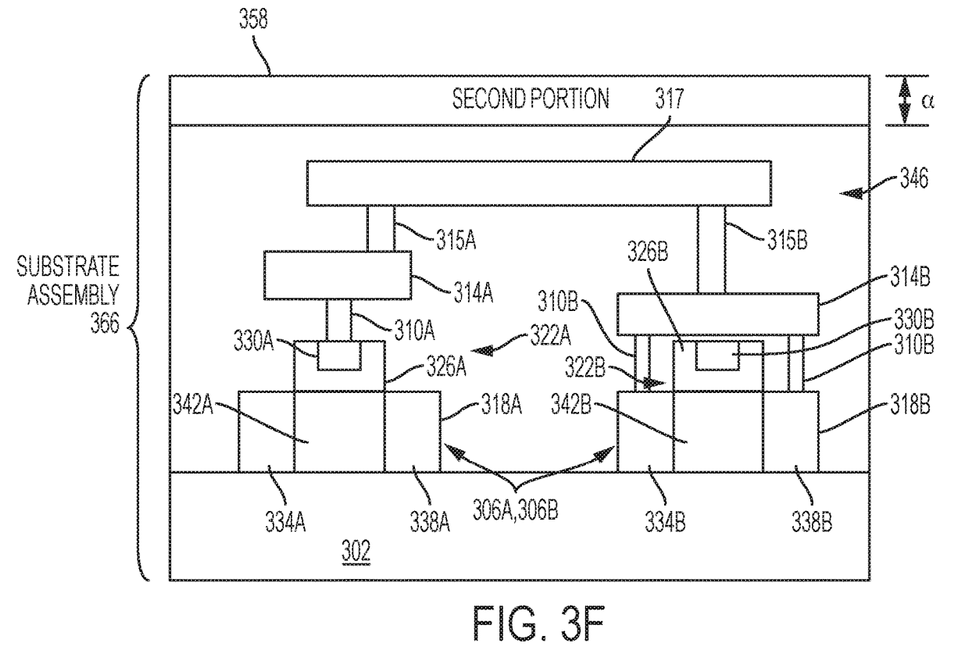

The heat 226 applied to the attached first substrate 302 and second substrate 304 also causes the separation 230 of the first portion 354 of the second substrate 304 from the layer with crystallographic defects 350. In some cases, this can be described as "exfoliation" of first portion 354 from the second substrate 304. As shown in FIG. 3E, in some cases some or all of the layer with crystallographic defects 350 remains on the second portion 358 after the heat induced separation 230 of the first portion 354. In some embodiments, any remaining layer 350 with crystallographic defects can be removed by standard polishing and planarization techniques, including but not limited to chemical mechanical polishing (CMP). In some examples, some of the material comprising the second portion 358 can be removed through continued chemical mechanical polishing so that a thickness (indicated in FIG. 3F as dimension a) can be within any of the following ranges: from 5 nm (nm) to 200 nm; from 5 nm to 100 nm; from 10 nm to 100 nm; from 10 nm to 50 nm; from 15 nm to 30 nm. The resulting structure, referred to herein as a substrate assembly 366, is shown in FIG. 3F.

In another embodiment, the fabrication of the second portion 358 can include the use of a silicon germanium (SiGe) layer. For example, a SiGe layer (of from 10 nm thick to 30 nm thick) on the second substrate can be composed and formed to have a coherent and epitaxial interface (i.e., a lattice parameter mismatch of less than 2%) with the underlying substrate (e.g., a silicon substrate). A silicon layer of from 10 nm to 20 nm thick corresponding to the second portion 358 can then be formed (epitaxially and coherently) on the SiGe layer. The defective layer 350 can then be formed via ion implantation (as described above) on a side of the SiGe layer opposite that of the silicon layer corresponding to the second portion 358. After separation of the second portion 358 from the substrate, the crystallographically defective layer can be removed via CMP until the SiGe layer is exposed. Silicon can be selectively removed from SiGe using CMP processes that include ammonium hydroxide (NH$_4$OH) or tetramethyl ammonium hydroxide (N(CH$_3$)$_4$OH). In this way, the SiGe acts an "etch stop." In other words, the processes used to remove the silicon layer are composed so as to not remove the SiGe layer or remove it at a rate that is at least 5 times slower than silicon is removed. Once the SiGe layer is exposed and subsequently detected, the etch composition can be changed so that the SiGe layer can be removed using a selective etch that removes SiGe but does not remove Si (e.g., KOH,). Using a SiGe layer as an etch stop as described above can, in some examples, enhance control of a thickness a of the second portion 358.

Figure 3G:
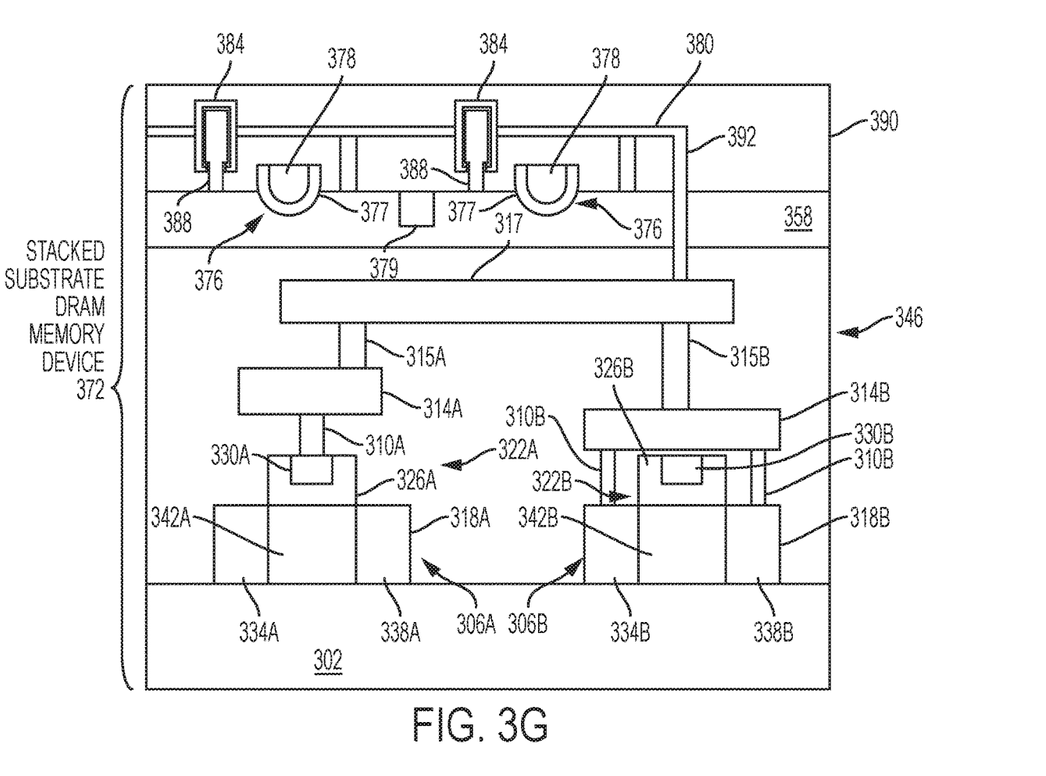

Having thus prepared the substrate assembly 366, DRAM cell components and memory arrays can be formed 234 on the exposed surface of the second portion 358 on a side opposite that of the first substrate 302 and associated peripheral circuits. This forms a stacked-substrate DRAM memory device 372, an example of which is shown in FIG. 3G. It will be appreciated that the second portion 358 essentially becomes a semiconductor substrate on which semiconductor devices can be fabricated, as is explained below. Similar to the preceding cross-sections, the cross-section of FIG. 3G is taken perpendicular to word lines of the DRAM memory array.

The portion of the embodiment of the stacked-substrate DRAM memory device 372 shown in FIG. 3G includes the substrate assembly 366, described above, as well as word lines 376, bit lines 380, capacitors 384, interconnections 388, and inter-substrate via 392.

In the example shown in FIG. 3G, the word lines 376 control (colloquially, "gate") access between the bit lines 380 and their corresponding capacitors 384, the latter of which can store a bit of data. The word lines 376 are conductive lines often fabricated from silicon or some other conductive semiconductor material that can be biased to an on state and an off state, thus controlling access (e.g., reading from and writing to) the memory cell capacitors 384. In the example shown, the word lines 376 include a gate dielectric layer 377 and a gate electrode layer 378. Any of the materials described above in the context of FinFET gate dielectric and gate electrode layers are applicable to the corresponding word line 376. In one example, SiO$_2$ can be used as the gate dielectric layer 377 and Si as the gate electrode layer 378. As also indicated above, the gate dielectric layer 377 and the gate electrode layer 378 can be fabricated from one or more layers. For examples in which more than one layer forms either or both of the gate dielectric layer 377 and the gate electrode layer 378, the layers can be compositionally similar or compositionally different.

As also shown in the example stacked-substrate DRAM memory device 372, the word lines 376 have an arcuate transverse cross-sectional portion that is recessed into the second substrate 304. These "recessed channel access transistors" ("RCATs") can increase an effective channel length relative to devices that have a more rectangular cross-section. Longer effective channel length can reduce off state leakage current ("I$_{Off}$"), thus improving device performance.

In some examples, RCATs can be fabricated by using standard techniques to remove a portion of a substrate (or more generically a layer of semiconductor material that includes the substrate or is on the substrate, and that may or may not be doped in different examples) by, for example, lithographic patterning and etching. A gate dielectric layer 377 and gate electrode layer 378 (composed of any of the possible materials described above) can then be sequentially formed in the recess using standard techniques. In some examples, a cross-sectional profile perpendicular to the gate of the word lines 376, such as that illustrated in FIG. 3G, may be curved or "arcuate." In other examples, a cross-sectional profile perpendicular to the gate of the word lines 376 can be rectangular. It will be appreciated that due to natural process variation, a cross-sectional profile of any shape may have curved portions and linear portions and otherwise not conform exactly to a geometric shape.

While RCATs are shown in FIG. 3G, it will be appreciated that any type of word line 376 configuration can be used in embodiments of the present disclosure. Regardless of the type of word line 376 used, it will be appreciated that the word lines 376 regulate access of the bit lines 380 (and access transistors, not shown) to the capacitors 384.

Bit lines 380 can, in some examples, be fabricated using a dual damascene process within an ILD layer 390, as explained above. For example, a trench having a first portion narrower than a second portion can be formed in dielectric layer 390 using standard lithographic patterning and etching techniques. Layer(s) of a liner (e.g., tantalum, tantalum nitride, tungsten nitride) can be formed followed by formation of conductive materials (e.g., tungsten, copper, aluminum) within the liner, thus forming vias 388 and bit lines 380. In other examples, a single damascene process can be used to separately form the trenches corresponding to the vias 388 and bit lines 380, both of which are subsequently filled with liner(s) and conductive material(s), respectively.

The capacitors 384 can be any type of capacitor compatible within a DRAM memory array, including the type shown in FIG. 3G, a capacitor over bit line (or "COB"). In some examples, the COB capacitor 384 illustrated in FIG. 3G is a metal-insulator-metal or "MIM" capacitor. It will be appreciated that the COB MIM capacitor 384 shown in FIG. 3G is selected only for convenience, and that other types of capacitors may be used in embodiments of the present disclosure.

In the COB type capacitor 384 shown, a dual damascene trench is formed in the dielectric layer 390. The narrower portion of the trench is filled with any required conductive liner(s) and then filled with a conductive material (e.g., copper, aluminum), thus forming corresponding ones of the via interconnection 388. The via interconnection 388 can then place the capacitor 384 in communication with the word line 376, the latter of which, as explained above, controls access between the bit line 380 and the capacitor 384. After formation of the via 388, a conductive metal layer is conformally formed in the second portion of the trench. This conductive metal layer, formed on walls of the trench formed by the etched portion of the dielectric layer 390, forms the outermost metal layer of the MIM capacitor 384. A layer of dielectric material (e.g., a high k material) is then conformally formed on the conductive metal layer, followed by filling the remaining portion of the trench with a conductive material. This series of layers then forms the metal-insulator-metal structure of the MIM capacitor.

An isolation barrier 379 is disposed between adjacent word lines 376 (e.g., STI or an unbiased "dummy" word line), as described above in the context of FIG. 1D.

Having thus formed the various elements of a DRAM memory array on the second portion 358 of the second substrate and the corresponding peripheral circuits on the first substrate 302, the memory arrays and peripheral circuits can be placed into contact (e.g., electrical communication) with one another. This can be accomplished by forming 238 a via 392 that extends from the bit line 380, through the dielectric layer 390, the second portion 358 of the second substrate, and the dielectric layer 346. In this example, the via 392 is connected to the conductive interconnection 317. It will be appreciated that in other examples, a via 392 can extend to different levels of conductive interconnect or even to a contact on a drain region of a semiconductor device (e.g., contact structure 310B on drain region 338B). The via 392 can be formed 238 using standard techniques, such as lithographic patterning and etching. These have been described above in the context of interconnections 310, 314, 315, 317, among others, and need no further explanation.

The placement of the via 392 can be selected using standard optical alignment techniques used to align various levels of interconnections. In some examples in which the second portion 358 of the second substrate 304 is optically transparent (due to its thickness a of less than 200 nm, less than 100 nm, or in some cases even less than 50 nm), standard alignment techniques can be used to align the via 392 with corresponding structure (whether conductive interconnection of a peripheral circuit or semiconductor device) on the first substrate 302. In some examples, these standard alignment techniques involve the use of alignment structures and/or patterns that can be used as reference points by which lithographic masks and other process tools can be aligned. In other examples, some of the second portion 358 of the second substrate 304 can be removed (e.g., by lithographic patterning and etching) so that these alignment structures on the first substrate 302 (sometimes colloquially referred to as "fiducial structure" or "alignment marks") can be detected.

As described above, because the thickness a of the second portion is less than 200 nm (and in some cases less than 100 nm), the formation of the via 392 can use techniques similar or the same as those used to form interconnections 315A, 315B, 310A, 310B. That is, standard single damascene or dual damascene techniques for the fabrication of vias between metal levels in a "back end of line" (BEOL) of an integrated circuit can be adapted to the via 392 by selecting processes that can pattern dielectric material 390, second substrate second portion 358 (whether silicon or some other composition), and then dielectric material 346. As also indicated above, a depth of the via 392 can correspond to the thickness of the second portion 358 plus 5-10 nm above the surface (to contact to the bit line 380) and plus 5-10 nm below the second portion 358 (to contact peripheral circuit interconnections). In embodiments, a depth of the via 392 is less than 200 nm, less than 100 nm, less than 50 nm, or less than 20 nm. In embodiments, the depth of via 392 corresponding to (and in some cases 5 nm-20 nm greater than) the thickness a of the second portion 358 leads to a via 392 electrical resistance of from 1 Ohm to 40 Ohms or within any of the following sub-ranges: 1 Ohm to 5 Ohms; 1 Ohm to 10 Ohms; 10 Ohms to 30 Ohms; 15 Ohms to 35 Ohms.

Example System

Figure 4:
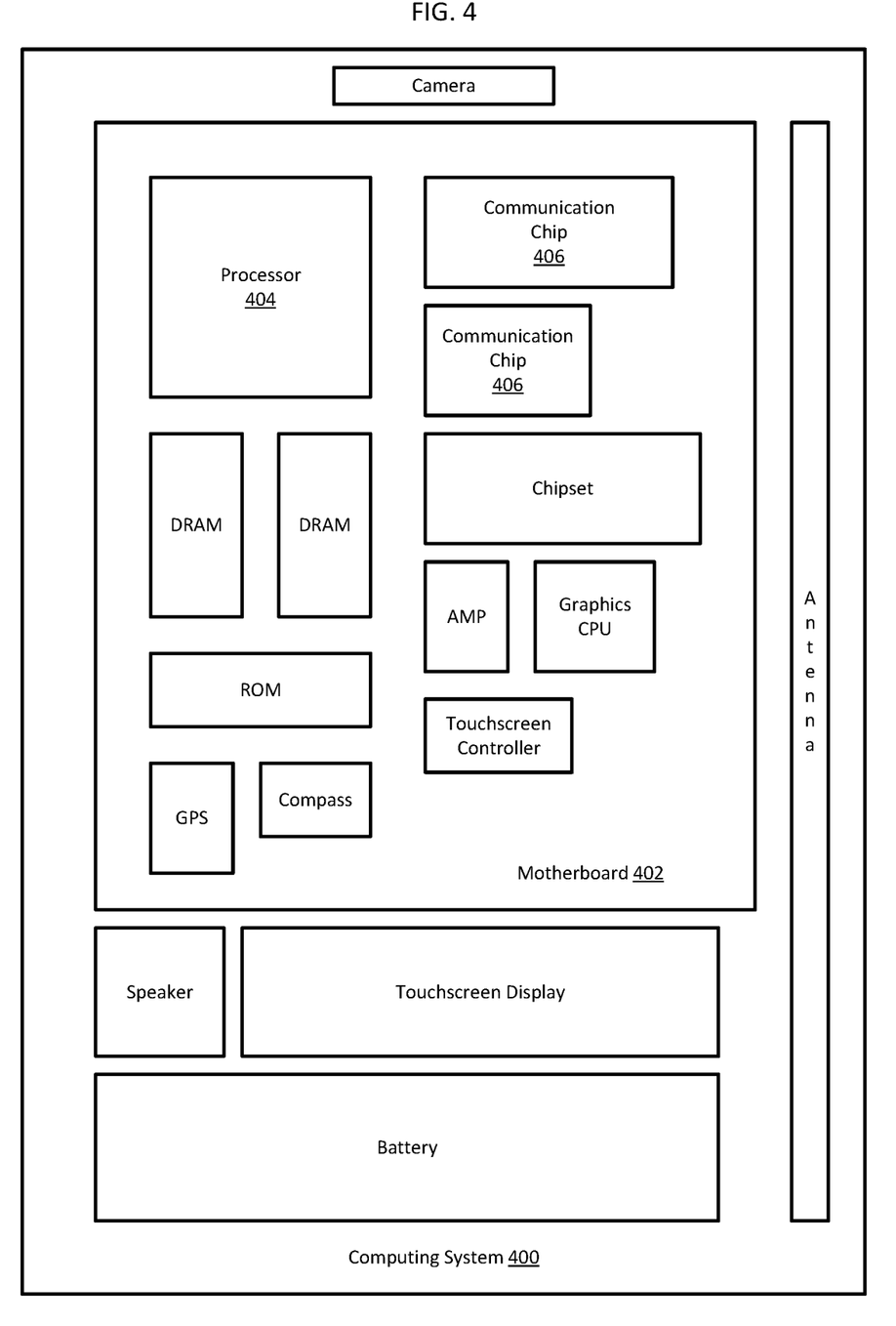
FIG. 4 illustrates a computing system implemented with integrated circuit structures and/or transistor devices formed using the techniques disclosed herein, in accordance with some embodiments of the present disclosure.

FIG. 4 is an example computing system implemented with one or more of the integrated circuit structures as disclosed herein, in accordance with some embodiments of the present disclosure. As can be seen, the computing system 400 houses a motherboard 402. The motherboard 402 may include a number of components, including, but not limited to, a processor 404 and at least one communication chip 406, each of which can be physically and electrically coupled to the motherboard 402, or otherwise integrated therein. As will be appreciated, the motherboard 402 may be, for example, any printed circuit board, whether a main board, a daughterboard mounted on a main board, or the only board of system 400, etc.

Depending on its applications, computing system 400 may include one or more other components that may or may not be physically and electrically coupled to the motherboard 402. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 400 may include one or more integrated circuit structures or devices configured in accordance with an example embodiment (e.g., to include one or more stacked-substrate DRAM memory devices, as variously provided herein). In some embodiments, multiple functions can be integrated into one or more chips (e.g., for instance, note that the communication chip 406 can be part of or otherwise integrated into the processor 404).

The communication chip 406 enables wireless communications for the transfer of data to and from the computing system 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others. In some embodiments, communication chip 406 may include one or more transistor structures having a gate stack an access region polarization layer as variously described herein.

The processor 404 of the computing system 400 includes an integrated circuit die packaged within the processor 404. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 406 also may include an integrated circuit die packaged within the communication chip 406. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 404 (e.g., where functionality of any chips 406 is integrated into processor 404, rather than having separate communication chips). Further note that processor 404 may be a chip set having such wireless capability. In short, any number of processor 404 and/or communication chips 406 can be used. Likewise, any one chip or chip set can have multiple functions integrated therein.

In various implementations, the computing system 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit device comprising: a first semiconductor substrate; a second semiconductor substrate that is less than 200 nm thick; an integrated circuit over the first semiconductor substrate and below the second semiconductor substrate, the integrated circuit comprising a source region, a drain region, a semiconductor body between the source region and the drain region, a gate structure over the semiconductor body, a first contact structure over the source region and a second contact structure over the drain region; a dielectric layer over the integrated circuit and between the first semiconductor substrate and the second semiconductor substrate; a memory array over the second semiconductor substrate, the memory array including at least one capacitor, at least one bit line, and at least one word line; and a via connecting the at least one bit line to one or more of the gate structure, the first contact structure, and the second contact structure.

Example 2 includes the subject matter of Example 1, wherein the memory array of the second semiconductor substrate is a DRAM memory array.

Example 3 includes the subject matter of Example 1 or 2, wherein the integrated circuit is a first integrated circuit, a second integrated circuit, and a conductive line connecting the first integrated circuit and the second integrated circuit, and further wherein the via connects the bit line of the memory array to the conductive line.

Example 4 includes the subject matter of any of the preceding Examples, wherein the integrated circuit comprises a peripheral circuit associated with the memory array.

Example 5 includes the subject matter of Example 4, wherein the peripheral circuit comprises a sense amplifier circuit.

Example 6 includes the subject matter of any of the preceding Examples, wherein one or more of the source region, the drain region, and the semiconductor body of the integrated circuit comprises a fin of a semiconductor material.

Example 7 includes the subject matter of any of the preceding Examples, wherein the at least one word line comprises a recessed channel access transistor, at least a portion of which is disposed within the second semiconductor substrate.

Example 8 includes the subject matter of Example 7, wherein the portion of the at least one word line disposed within the second semiconductor substrate has a curved transverse cross-sectional profile.

Example 9 includes the subject matter of any of the preceding Examples, wherein the second semiconductor substrate is from 15 nm to 50 nm thick.

Example 10 includes the subject matter of Example 9, wherein the via has a depth of from 15 nm to 50 nm.

Example 11 includes the subject matter of any of the preceding Examples, wherein the second semiconductor substrate is from 10 nm to 20 nm thick.

Example 12 includes the subject matter of Example 11, wherein the via has a depth of from 10 nm to 20 nm.

Example 13 includes the subject matter of any of the preceding Examples, wherein the second semiconductor substrate is optically transparent.

Example 14 includes the subject matter of any of the preceding Examples, wherein the at least one capacitor is a capacitor over bit line type capacitor.

Example 15 includes the subject matter of any of the preceding Examples, further comprising: an additional dielectric layer over the memory array; a third semiconductor substrate over the additional dielectric layer; an additional memory array over the third semiconductor substrate; and at least one additional via connecting the memory array over the third semiconductor substrate to the integrated circuit of the first semiconductor substrate.

Example 16 includes the subject matter of any of the preceding Examples, wherein the via passes through the second semiconductor substrate and into the dielectric layer between the first semiconductor substrate and the second semiconductor substrate.

Example 17 includes the subject matter of any of the preceding Examples, wherein the dielectric layer is in contact with the integrated circuit and the second semiconductor substrate.

Example 18 includes the subject matter of any of the preceding Examples, wherein the via comprises an electrical resistance of from 1 Ohm to 40 Ohms.

Example 19 is a method for forming an integrated circuit device, the method comprising: providing a first substrate and a second substrate; forming a peripheral circuit for operating a DRAM memory array over the first substrate, the peripheral circuit comprising at least one semiconductor device and at least one interconnect structure; forming a layer of dielectric material over the peripheral circuit; exposing the layer of dielectric material of the first substrate and a surface of the second substrate to a plasma; after exposure to the plasma, placing the surface of the second substrate in contact with the layer of dielectric material of the first substrate; heating the second substrate and the first substrate while maintaining contact therebetween; forming a memory cell on the second substrate; and forming a via through the second substrate, into the layer of dielectric material, and to the peripheral circuit, thereby connecting the via and the peripheral circuit.

Example 20 includes the subject matter of Example 19, further comprising implanting the second substrate with hydrogen ions, the implanting creating a sub-surface layer of crystallographic defects that divides the second substrate into a first portion and a second portion; and removing the first portion from the sub-surface layer of crystallographic defects, wherein the second portion is placed in contact with the layer of dielectric material of the first substrate and the memory cell is formed on an exposed surface of the second portion, the second portion less than 200 nm thick.

Example 21 includes the subject matter of Examples 19 or 20, further comprising aligning the memory cell and the via with the peripheral circuit using alignment marks on the first substrate that are detectable through the second substrate.

Example 22 includes the subject matter of any of Examples 19 to 21, wherein the plasma is an oxygen plasma, the oxygen plasma creating a plurality of hydroxyl groups on the layer of dielectric material and the surface of the second substrate.

Example 23 includes the subject matter of Example 22, wherein heating the second substrate on the first substrate causes a condensation reaction between opposing hydroxyl groups on the layer of dielectric material and the surface of the second substrate, the condensation reaction causing covalent bonds to form between the second substrate and the first substrate.

What is claimed is:

1. An integrated circuit device comprising:
    a first semiconductor substrate;
    a second semiconductor substrate;
    an integrated circuit over the first semiconductor substrate and below the second semiconductor substrate, the integrated circuit comprising a source region, a drain region, a semiconductor body between the source region and the drain region, a gate structure over the semiconductor body, a first contact structure over the source region and a second contact structure over the drain region;
    a dielectric layer over the integrated circuit and between the first semiconductor substrate and the second semiconductor substrate;
    a memory array, the memory array including at least one capacitor, at least one bit line, and at least one word line over the second semiconductor substrate, wherein the at least one bit line extends over the at least one word line; and
    a via connecting the at least one bit line to one or more of the gate structure, the first contact structure, or the second contact structure, the via extending through the second substrate.

2. The integrated circuit device of claim 1, wherein the memory array of the second semiconductor substrate is a DRAM memory array.

3. The integrated circuit device of claim 1, wherein the integrated circuit is a first integrated circuit, a second integrated circuit, and a conductive line connecting the first integrated circuit and the second integrated circuit, and further wherein the via connects the bit line of the memory array to the conductive line.

4. The integrated circuit device of claim 1, wherein the integrated circuit comprises a peripheral circuit associated with the memory array.

5. The integrated circuit device of claim 4, wherein the peripheral circuit comprises a sense amplifier circuit.

6. The integrated circuit device of claim 1, wherein one or more of the source region, the drain region, and the semiconductor body of the integrated circuit comprises a fin of a semiconductor material.

7. The integrated circuit device of claim 1, wherein the at least one word line comprises a recessed channel access transistor, at least a portion of which is disposed within the second semiconductor substrate.

8. The integrated circuit device of claim 1, wherein the second semiconductor substrate is from 15 nm to 50 nm thick.

9. The integrated circuit device of claim 8, wherein the via has a depth of from 15 nm to 50 nm.

10. The integrated circuit device of claim 1, wherein the second semiconductor substrate is from 10 nm to 20 nm thick.

11. The integrated circuit device of claim 10, wherein the via has a depth of from 10 nm to 20 nm.

12. The integrated circuit device of claim 1, wherein the second semiconductor substrate is optically transparent.

13. The integrated circuit device of claim 1, further comprising:
    an additional dielectric layer over the memory array;
    a third semiconductor substrate over the additional dielectric layer;
    an additional memory array over the third semiconductor substrate; and
    at least one additional via connecting the memory array over the third semiconductor substrate to the integrated circuit of the first semiconductor substrate.

14. The integrated circuit device of claim 1, wherein the via passes through the second semiconductor substrate and into the dielectric layer between the first semiconductor substrate and the second semiconductor substrate.

15. The integrated circuit device of claim 1, wherein the via comprises an electrical resistance of from 1 Ohm to 40 Ohms.

* * * * *